United States Patent
Choi et al.

(10) Patent No.: US 8,552,443 B2
(45) Date of Patent: Oct. 8, 2013

(54) LIGHT EMITTING DEVICE, LIGHT EMITTING DEVICE PACKAGE AND LIGHTING SYSTEM INCLUDING THE SAME

(75) Inventors: Jeong Hyeon Choi, Seoul (KR); Jae Wook Kim, Seoul (KR); Jeung Mo Kang, Suwon-si (KR); Du Hyun Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 728 days.

(21) Appl. No.: 12/709,087

(22) Filed: Feb. 19, 2010

(65) Prior Publication Data

US 2010/0213488 A1   Aug. 26, 2010

(30) Foreign Application Priority Data

Feb. 20, 2009  (KR) ........................ 10-2009-0014257

(51) Int. Cl.
*H01L 33/00* (2010.01)
(52) U.S. Cl.
USPC ................... 257/98; 257/79; 257/88; 257/99; 257/113; 438/26; 438/29
(58) Field of Classification Search
None
See application file for complete search history.

(56) References Cited

U.S. PATENT DOCUMENTS

| | | | |
|---|---|---|---|
| 3,849,738 A | 11/1974 | Hakki | |
| 3,858,965 A | 1/1975 | Sumita | |
| 5,777,792 A * | 7/1998 | Okada et al. | 359/584 |
| 6,590,702 B1 | 7/2003 | Shirai | |
| 2002/0042157 A1 | 4/2002 | Kikawa et al. | |
| 2007/0023763 A1* | 2/2007 | Takigawa et al. | 257/79 |
| 2007/0069228 A1 | 3/2007 | Miller et al. | |
| 2007/0187702 A1 | 8/2007 | Lee et al. | |
| 2008/0068821 A1* | 3/2008 | Wang et al. | 362/84 |

FOREIGN PATENT DOCUMENTS

| | | |
|---|---|---|
| DE | 103 39 982 A1 | 4/2005 |
| JP | 61-77002 A | 4/1986 |
| JP | 1047082 A | 2/1989 |
| JP | 5-129277 A | 5/1993 |
| JP | 5-327128 A | 12/1993 |
| JP | 6-151959 A | 5/1994 |
| JP | 7-235684 A | 9/1995 |
| JP | 11-274642 A | 10/1999 |
| JP | 2002-311206 A | 10/2002 |
| KR | 10-0622817 B1 | 9/2006 |
| KR | 10-0654508 B1 | 11/2006 |
| WO | WO 00/58761 A1 | 10/2000 |

* cited by examiner

*Primary Examiner* — Kyoung Lee
(74) *Attorney, Agent, or Firm* — Birch, Stewart, Kolasch & Birch, LLP

(57) ABSTRACT

Provided are a light emitting device, a light emitting device package and a lighting system comprising the same. The light emitting device comprises a light emitting structure comprising a first conductive type semiconductor layer, an active layer, and a second conductive type semiconductor layer, and an anti-reflection region on a lateral surface of the light emitting structure.

12 Claims, 7 Drawing Sheets

LIGHT EMITTING DEVICE, LIGHT EMITTING DEVICE PACKAGE AND LIGHTING SYSTEM INCLUDING THE SAME

CROSS-REFERENCE TO RELATED APPLICATIONS

This application claims under 35 U.S.C. §119 to Korean Patent Application No. 10-2009-014257, filed Feb. 20, 2009, which is hereby incorporated by reference in its entirety.

BACKGROUND

Embodiments relate to a light emitting device, a light emitting device package and a lighting system including the same.

Nitride semiconductors are attracting much attention for the fields of optical devices and high-power electronic devices because of their high thermal stability and wide band gap energy. In particular, blue light emitting devices (LEDs), green LEDs, and UV LEDs that use nitride semiconductors have been commercialized and are widely used.

Light emitting diodes are now being used as a light source for a display device, an indoor and outdoor lighting, and a headlamp for a vehicle. Specifically, many products with respect to a high power LED applicable to a backlight unit (BLU) of such a LED are being developed.

An edge-type BLU structure is used for a relative small sized LED BLU, and a vertical-type BLU structure is used for a relative large sized LED BLU.

However, in case of the vertical-type BLU structure used for a large-area LCD, since it is necessary that a space having a thickness of greater than a certain thickness is defined to realize color mixing and uniform light-emission, it is impossible to reduce the overall thickness of the LED BLU to a thickness of less than a certain thickness. That is, in case of a whit LED using a phosphor, the uniform light-emission should be necessarily required. Also, in case of using, e.g., RGB LEDs, the LED BLU should have a thickness of greater than a certain thickness to realize white color through mixing of RGB colors and uniform light-emission.

To overcome such limitations, the LED BLU may be reduced in thickness using an optics lens having a specific shape. In this case, the optics lens may be complicated in design, and a light emitting pattern should be carefully considered. Thus, there are limitations that the design and manufacturing processes may be difficult, and an additional cost may occur.

Also, although a radiation pattern and a lens structure for realizing a light emitting pattern in a lateral direction are proposed in a related art technique, it may be difficult to design the lens, as well as manufacturing costs may increase.

SUMMARY

Embodiments provide a light emitting device having improved light emission efficiency, a light emitting device package and a lighting system including the same.

In one embodiment, a light emitting device comprises: a light emitting structure comprising a first conductive type semiconductor layer, an active layer, and a second conductive type semiconductor layer; and an anti-reflection region on a lateral surface of the light emitting structure.

In another embodiment, a light emitting device package comprises: a light emitting device comprising an anti-reflection region on a lateral surface of a light emitting structure; and a package body in which the light emitting device is disposed.

In another embodiment, a lighting system comprises: a light emitting module comprising a light emitting device package including a light emitting device comprising an anti-reflection region on a lateral surface of a light emitting structure; and a package body in which the light emitting device is disposed.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package and a lighting system including the same according to an embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
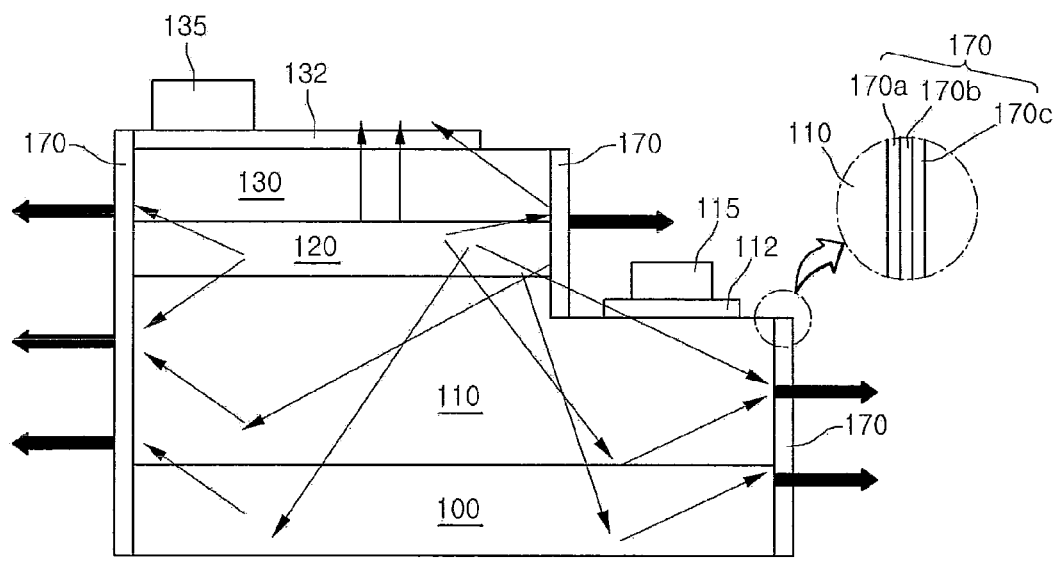
FIG. 1 is a sectional view of a light emitting device according to a first embodiment.

FIG. 1 is a sectional view of a light emitting device according to a first embodiment.

A light emitting device (LED) according to a first embodiment includes a first conductive type semiconductor layer 110 disposed on a first substrate 100, an active layer 120, and a second conductive type semiconductor layer 130. A first electrode 115 and a second electrode 135 are disposed on the first conductive type semiconductor layer 110 and the second conductive type semiconductor layer 130, respectively. Also, the LED may have an anti-reflection region defined on side surfaces of the first substrate 100, the first conductive type semiconductor layer 110, the active layer 120, and the second conductive type semiconductor layer 130.

FIG. 1 illustrates a vertical sectional view of a lateral type LED. In the first embodiment, an anti-reflection region may be an anti-reflection layer 170, but is not limited thereto.

In the LED according to the first embodiment, the anti-reflection layer 170 that corresponds to the anti-reflection region may be disposed on a lateral surface of the light emitting device to improve light emission efficiency.

According to this embodiment, the anti-reflection region may be defined on the lateral surface of the LED to improve a degree in which light generated in the active layer 120 or light reflected and refracted from a substrate and a GaN semiconductor layer is emitted the outside through the lateral surface, thereby improving light extraction efficiency.

This may improve color mixing and light emission uniformity in a backlight unit (BLU) using the above-described LED to reduce a thickness of the BLU on the whole. Also, according to this embodiment, a complicated lens or radiation pattern, which is required in a related art technique, may be easily designed, and thus manufacturing costs may be reduced.

Figure 2:
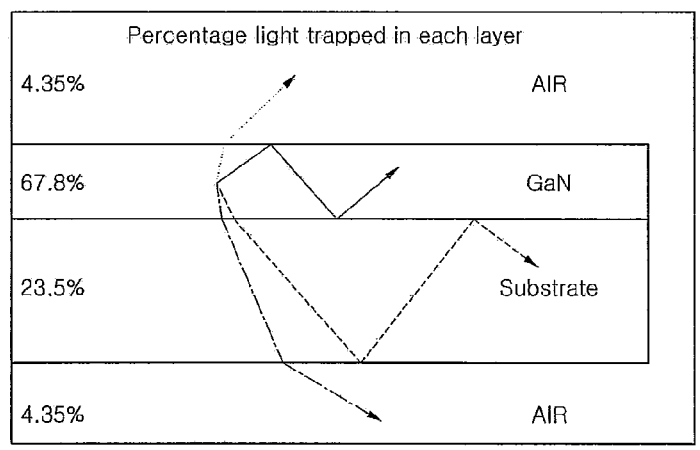
FIG. 2 is a view illustrating a degree in which light generated in a light emitting device is trapped by each layer.

FIG. 2 is a view illustrating a degree in which light generated in an LED is trapped by each layer.

That is, FIG. 2 illustrates how much light generated within the LED is extracted to air. In general, since the GaN semiconductor layer has a relative high refractive index, light exists within the GaN semiconductor layer and the substrate, and thus, only a portion of the light is emitted to the outside. Also, since such a mechanism may similarly occur at the lateral surface of the LED as well as upper and lower portions of the LED. Thus, it may be difficult to emit the light in a lateral direction because the GaN semiconductor layer and the substrate have relative large refractive indexes.

In this embodiment, since the anti-reflection layer or a fine roughness is disposed on the lateral surface to improve the extraction efficiency in the lateral direction, the LED may be advantageously applicable to the BLU.

Figure 3:
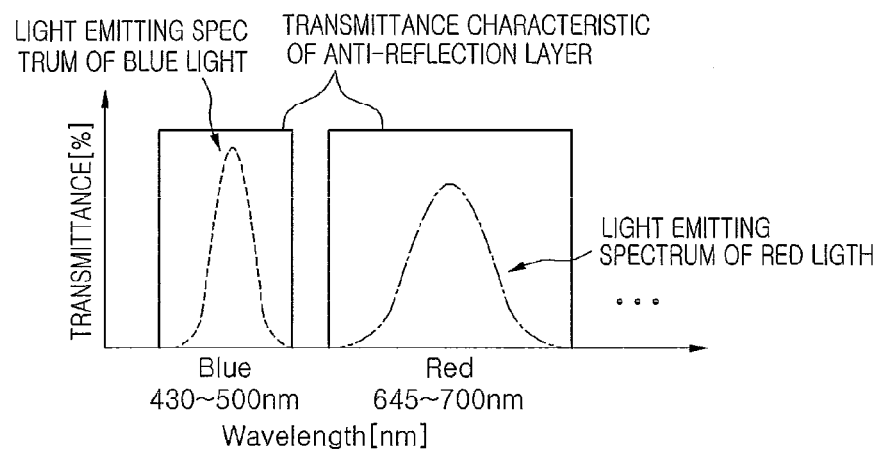
FIG. 3 is a graph illustrating a transmittance curve of an anti-reflection layer required corresponding to a wavelength band of desired light.

FIG. 3 is a graph illustrating a transmittance curve of an anti-reflection layer required corresponding to a wavelength band of desired light.

For example, in case of an LED emitting blue light, when the anti-reflection layer is disposed to obtain a high transmittance in an entire region of a blue spectrum or a portion of a region of the blue spectrum, the light extraction may be improved in the lateral direction as proposed in this embodiment. Also, in case of an LED emitting red light, when the anti-reflection layer is disposed to obtain a high transmittance in an entire region of a red spectrum or a portion of a region of the red spectrum, the light extraction may be improved in the lateral direction as proposed in this embodiment. Similarly, these effects may be applicable to another color having a different wavelength by using the same method.

Hereinafter, a method of manufacturing the LED according to the first embodiment will be described with reference to FIG. 1.

As shown in FIG. 1, a first substrate 100 may be prepared. The first substrate 100 may be a sapphire substrate, but is not limited thereto. A wet etching process may be performed on the first substrate 100 to remove impurities on a surface of the first substrate 100. A buffer layer (not shown) may be formed on the first substrate 100. For example, an undoped layer may be formed on the first substrate 100.

Thereafter, a first conductive type semiconductor layer 110 may be formed on the first substrate 100. For example, the first conductive type semiconductor layer 110 may be formed using a chemical vapor deposition (CVD) process, a molecular beam epitaxy (MBE) process, a sputtering process, or a hydride vapor phase epitaxial (HYPE) deposition process. Also, silane gas ($SiH_4$) containing N-type impurities such as trimethylgallium gas (TMGa), ammonia gas ($NH_3$), nitrogen gas ($N_2$), hydrogen gas ($H_2$), and silicon (Si) may be injected into a chamber to form the first conductive type semiconductor layer 110.

An active layer 120 may be formed on the first conductive type semiconductor layer 110. The active layer 120 severs as a layer in which electrons injected through the first conductive type semiconductor layer 110 recombine with electron holes injected through a second conductive type semiconductor layer 130 to emit light having an energy determined by a proper energy band of an active layer material.

The active layer 120 may have a single or multi quantum-well structure, an quantum-wire structure, or a quantum dot structure in which nitride semiconductor thin films having different energy bands are alternately stacked one time or several times. For example, in the active layer 120, trimethyl gallium (TMGa) gas, ammonia (NH3) gas, nitrogen (N2) gas, and trimethyl indium (TMIn) gas are injected to form a multi-quantum well structure having an InGaN/GaN structure, but is not limited thereto. The active layer 120 may have one or more structures of an InGaN/GaN structure, an InGaN/InGaN structure, an AlGaN/GaN structure, an AlGaN/GaN structure, a GaAs/AlGaAs(InGaAs) structure, and a GaP/AlGaP(InGaP) structure.

Hereafter, a second conductive type semiconductor layer 130 may be formed on the active layer 120. For example, bis (ethylcyclopentadienyl) magnesium ($EtC_{p2}Mg$) {Mg $(C_2H_5C_5H_4)_2$} containing p-type impurities such as trimethyl gallium (TMGa) gas, ammonia ($NH_3$) gas, nitrogen ($N_2$) gas, and magnesium (Mg) may be injected into the chamber to form the second conductive type semiconductor layer 130, but is not limited thereto.

Portions of the second conductive type semiconductor layer 130, the active layer 120, and the first conductive type semiconductor layer 110 may be removed to expose a portion of the first conductive type semiconductor layer 110. For example, a pattern mask (not shown) is formed, and then, the portions of the second conductive type semiconductor layer 130, the active layer 120, and the first conductive type semiconductor layer 110 may be removed using the pattern mask as an etch mask to expose the portion of the first conductive type semiconductor layer 110. The pattern mask may be formed of silicon nitride, silicon oxide, or a photoresist.

Then, the pattern mask may be removed to form a first electrode 115 on the exposed first conductive type semiconductor layer 110. At this time, in this embodiment, a first ohmic layer 112 may be formed on the exposed first conductive type semiconductor layer 110.

A second electrode 135 may be formed on the second conductive type semiconductor layer 130. At this time, in this embodiment, a transparent electrode layer 132 may be formed on the second conductive type semiconductor layer 130. For example, the transparent electrode layer 132 may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, Ni/IrOx/Au/ITO, Ni, Pt, Cr, Ti, and Ag, but is not limited thereto.

An anti-reflection layer 170 may be formed on lateral surfaces of the first substrate 100, the first conductive type semiconductor layer 110, the active layer 120, and the second conductive type semiconductor layer 130.

The anti-reflection layer 170 may be deposited using an E-beam evaporation process or a sputtering process. At this time, to obtain a desired reflectivity-wavelength curve, materials having a proper refractive index may be repeatedly deposited to improve light extraction efficiency in a lateral direction.

In this embodiment, since the anti-reflection layer 170 includes two or more layered thin films having refractive indexes different from each other, wavelengths of light reflected from a boundary between the thin films may be destructively interfere with each other. In this embodiment, two conditions for the destructive interference are required. A phase difference should exist to cause the destructive interference of the light, and also, amplitudes of the destruction light should match each other to minimize a reflectance during the destructive interference.

To reduce the reflectance, an optical thickness may be satisfied by odd multiples of λ/4. Thus, the anti-reflection layer 170 may be designed to have an optical thickness of about λ/4.

In this embodiment, main factors with respect to the anti-reflection layer 170 may include reflectances of a high refractive index material and a low refractive index material, the number of thin films, and a thickness of each layer. As a refractive index difference between two thin films increases, the reflectance is reduced. Also, a pattern of a reflective wavelength may be moved according to the thickness of the thin film. In addition, as the number of thin films increases, the reflectance is regularly reduced in a full wavelength region of visible light.

For example, to realize a relatively low reflectance in a relatively wide wavelength λ, the anti-reflection layer may have a structure in which two or more layers are stacked.

For example, in this embodiment, the forming of the anti-reflection layer 170 may include forming a first refractive layer 170a having a first refractive index and forming a second refractive layer 170c having a second refractive index greater than the first refractive index. In the anti-reflection layer 170, the first refractive layer 170a and the second refractive layer 170c may be repeatedly stacked.

For example, a two-layered anti-reflection layer 170 may include a low refractive layer and a high refractive layer having about λ/4 thicknesses. Also, the two-layered anti-reflection layer has a reflective pattern having a V-shape to minimize the reflectance at a specific wavelength. When compared to a single-layered anti-reflection layer, the two-layered anti-reflection layer 170 has a low average reflectance of about 1% in the visible light region.

Also, the anti-reflection layer 170 may be a three-layered anti-reflection layer 170. At this time, a third refractive layer 170b having a third refractive index greater than the second refractive index may be formed on the first refractive layer 170a, and the second refractive layer 170c may be formed on the third refractive layer 170b. In the anti-reflection layer 170, the first refractive layer 170a, the third refractive layer 170b, and the second refractive layer 170c may be repeatedly stacked.

For example, the three-layered anti-reflection layer 170 may include a low refractive layer having an about λ/4 thickness, a ultra-high refractive layer having an about λ/2 thickness, and a high refractive layer having an about λ/4 thickness. The three-layered anti-reflection layer 170 may have a reflective pattern having a W-shape. Also, the three-layered anti-reflection layer 170 has a very low average reflectance of less than about 1% in the full wavelength region of the visible light.

In this embodiment, in case of the low refractive layer, i.e., the first refractive layer 170a, a medium having a refractive index of about 1.3 to about 1.5 may be used. In case of the ultra-high refractive layer, i.e., the third refractive layer 170b, a medium having a refractive index of about 2.0 to about 2.5 may be used. In case of the high refractive layer, i.e., the second refractive layer, a medium having a refractive index of about 1.6 to about 1.8 may be used.

In this embodiment, $TiO_2$ or $ZrO_2$ may be used as a dielectric having a high refractive index, and $SiO_2$ may be used as a dielectric having a low refractive index, but are not limited thereto. For example, the material having the above-described refractive indexes may be replaced.

In this embodiment, the anti-reflection layer 170 may be formed using an E-beam evaporation process or a sputtering process.

In the LED according to this embodiment, the anti-reflection layer may be formed in the lateral direction of the LED, i.e., the anti-reflection region to improve the light emission efficiency in the lateral direction.

Figure 4A:
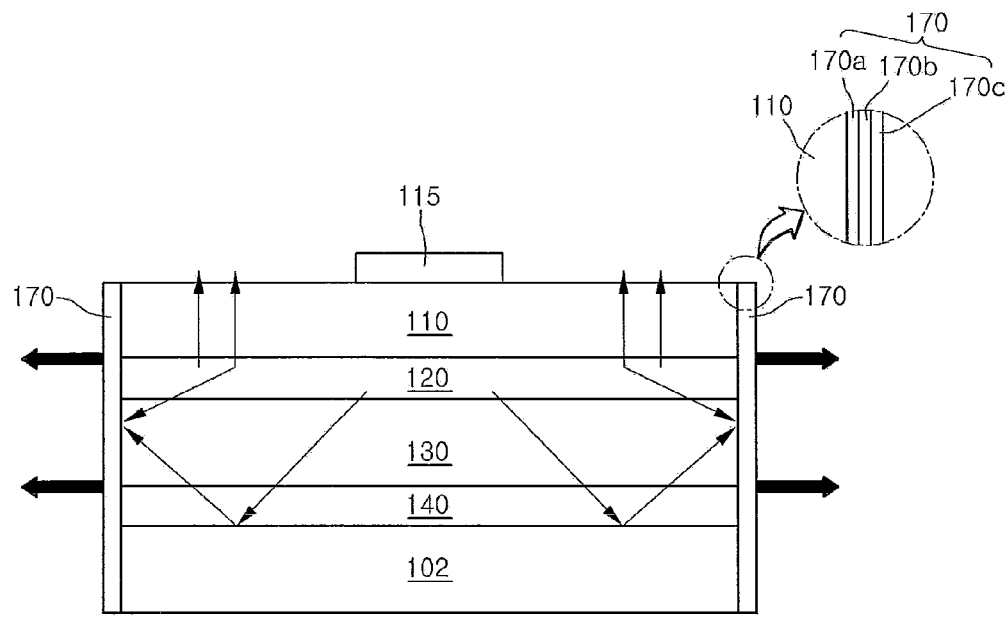
FIG. 4a is a sectional view of a light emitting device according to a second embodiment.

FIG. 4a is a sectional view of a light emitting device according to a second embodiment.

An LED according to a second embodiment may be a vertical-type LED different from that of the first embodiment. The second embodiment may adopt the technical characteristics of the first embodiment.

Hereinafter, a method of the LED according to the second embodiment will be described with reference to FIGS. 4b to 4d.

Figure 4B:
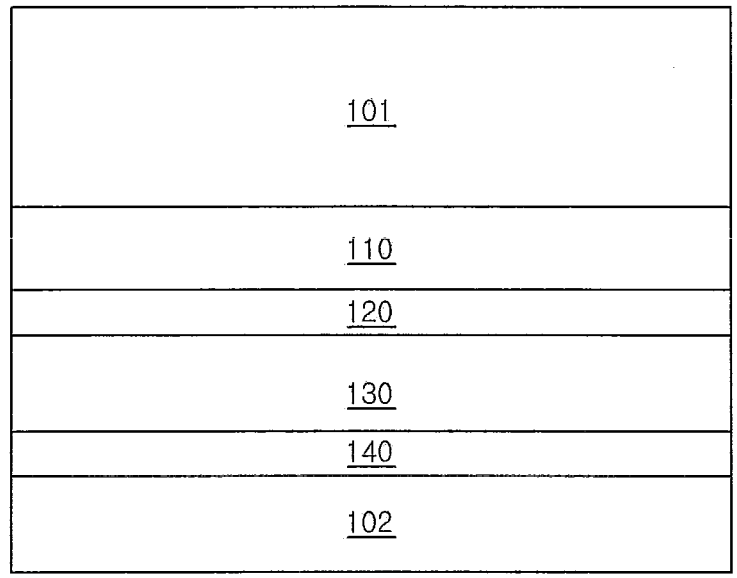
FIGS. 4b to 4d are sectional views illustrating a process of manufacturing a light emitting device according to a second embodiment.

As shown in FIG. 4b, a first substrate 101 is prepared. The first substrate 101 may be a sapphire substrate, but is not limited thereto. Thereafter, like the first embodiment, a first conductive type semiconductor layer 110, an active layer 120, and a second conductive type semiconductor layer 130 are formed on the first substrate 101. In the second embodiment, a second electrode layer 140 may be formed on the second conductive type semiconductor layer 130. The second electrode layer 140 may include an ohmic layer (not shown), a reflective layer (not shown), an adhesive layer (not shown), and a second substrate 102.

A single metal or a metal alloy may be multi-stacked to improve the efficiency of electron hole injection. At this time, when the ohmic layer is a transparent layer, a reflection layer that can perform a reflective function may be formed below the ohmic layer. The ohmic layer may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, Ni/IrOx/Au/ITO, Ni, Pt, Cr, Ti, and Ag, but is not limited thereto.

The reflection layer may include a metal layer containing Al, Ag, or an alloy containing Al or Ag. Also, in this embodiment, the second electrode layer 120 may include the adhesive layer.

Also, in this embodiment, the second substrate 102 may be further provided. If the first conductive type semiconductor layer 110 has a sufficiently thick thickness, i.e., a thickness of about 50 μm or more, a process of forming the second substrate 102 may be omitted. The second substrate 102 may be formed of a metal having good conductive properties, a metal alloy, or a conductive semiconductor material to efficiently inject carriers. For example, the second substrate 102 may be formed of copper (Cu), a Cu alloy, Si, molybdenum (Mo), or SiGe. The second substrate 102 may be formed using an electrochemical metal deposition method or a bonding method using eutectic metals.

Figure 4C:
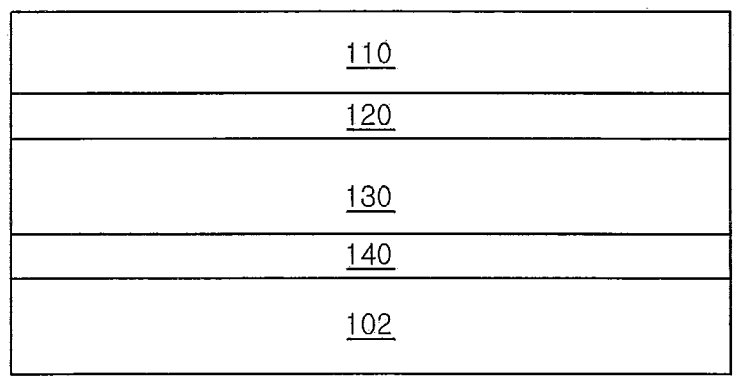

As shown in FIG. 4C, the first substrate 101 is removed to expose the first conductive type semiconductor layer 110. The first substrate 101 may be separated using a high power laser or removed using a chemical etching process. Also, the first substrate 101 may be removed by being physically polished.

The first substrate 101 is removed to expose the first conductive type semiconductor layer 110. The exposed first conductive type semiconductor layer 110 may include a surface defective layer generated when the first substrate 101 is removed. The surface defective layer may be removed using a wet or dry etching process.

Figure 4D:
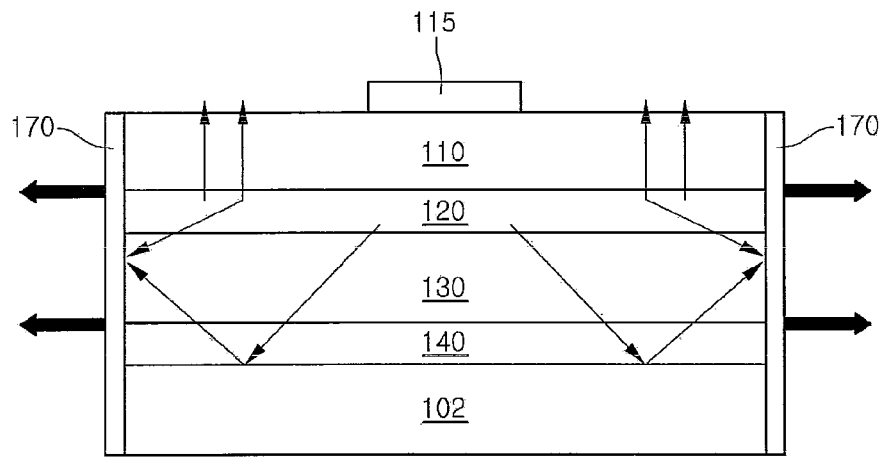

As shown in FIG. 4D, a first electrode 115 is formed on the first conductive type semiconductor layer 110.

Thereafter, like the first embodiment, an anti-reflection layer 170 is formed on lateral surfaces of the first substrate 101, the first substrate 101, the first conductive type semiconductor layer 110, the active layer 120, and the second conductive type semiconductor layer 130.

For example, the anti-reflection layer 170 may be a two-layered anti-reflection layer and include a low refractive layer and a high refractive layer having about λ/4 thicknesses. Also, the anti-reflection layer 170 has a reflective pattern having a V-shape to minimize a reflectance at a specific wavelength.

Also, the anti-reflection layer 170 may be a three-layered anti-reflection layer 170. At this time, a third refractive layer 170b having a third refractive index greater than a second refractive index may be formed on a first refractive layer 170a, and a second refractive layer 170c may be formed on the third refractive layer 170b.

The anti-reflection layer 170 may be deposited using an E-beam evaporation process or a sputtering process. At this time, to obtain a desired reflectivity-wavelength curve, materials having a proper refractive index may be repeatedly deposited to improve light extraction efficiency in a lateral direction.

Figure 5:
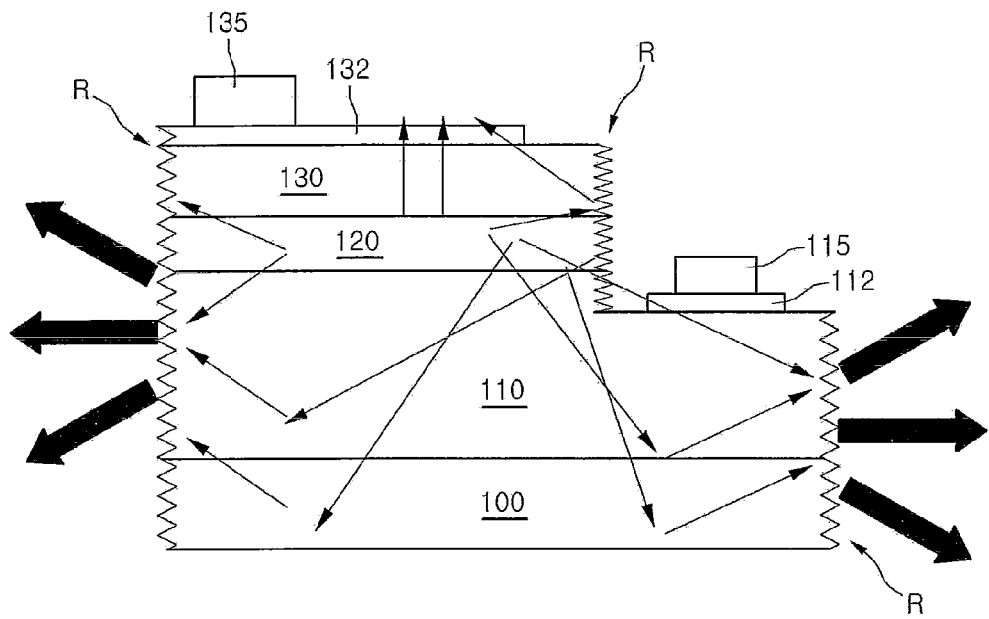
FIG. 5 is a sectional view of a light emitting device according to a third embodiment.

FIG. 5 is a sectional view of a lateral type light emitting device according to a third embodiment.

Unlike the first embodiment, a third embodiment illustrates an example in which a roughness R is formed as an anti-reflection region. The third embodiment may adopt the technical characteristics of the first embodiment.

According to the third embodiment, a selective etching process may be additionally performed during the LED manufacturing process to form a fine roughness R, thereby improving light extraction efficiency in a lateral direction.

For example, after a mesa etching process for exposing the first conductive type semiconductor layer 110 is performed, a wet or dry etching process may be performed to form the roughness R.

Figure 6:
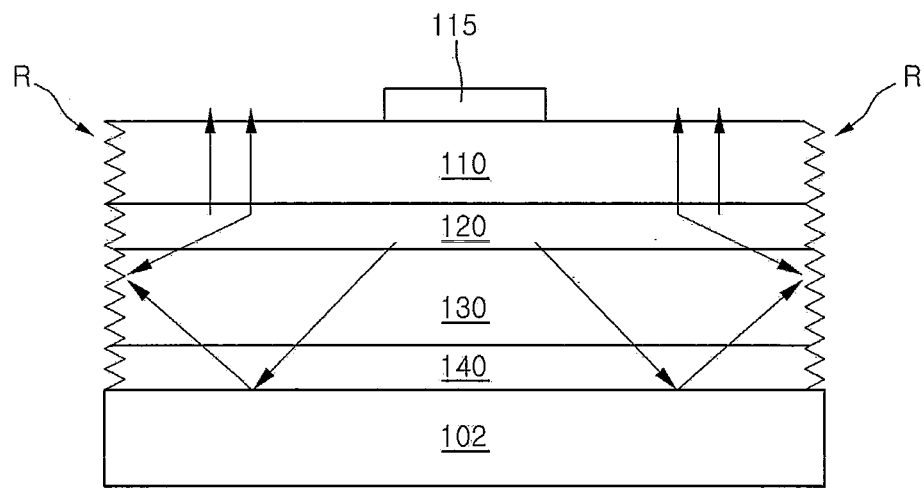
FIG. 6 is a sectional view of a light emitting device according to a fourth embodiment.

FIG. 6 is a sectional view of a light emitting device according to a fourth embodiment.

A fourth embodiment illustrates an example in which a roughness R is formed as an anti-reflection region. The fourth embodiment may adopt the technical characteristics of the second embodiment.

According to the fourth embodiment, a selective etching process may be additionally performed during the LED manufacturing process to form a fine roughness R, thereby improving light extraction efficiency in a lateral direction. For example, after a first substrate 101 is removed, a wet or dry etching process may be performed to form the roughness R.

Figure 7:
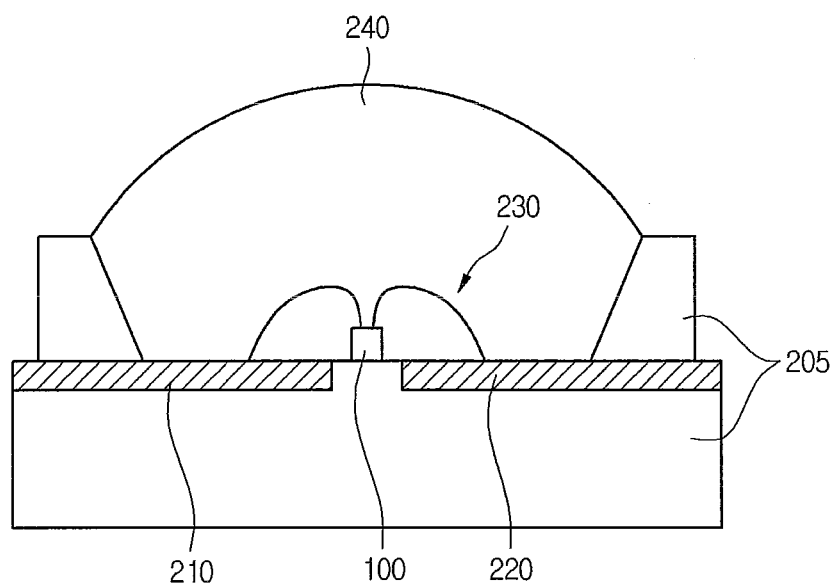
FIG. 7 is a sectional view of a light emitting device package according to an embodiment.

FIG. 7 is a sectional view of a light emitting device package according to an embodiment.

Referring to FIG. 7, a light emitting device package according to an embodiment includes a body 200, a third electrode layer 210 and a fourth electrode layer 220 disposed in the body 200, an LED 100 disposed in the body 200 and electrically connected to the third electrode layer 210 and the fourth electrode layer 220, and a molding member 400 surrounding the LED 100.

The body 200 may be formed of a silicon material, a synthetic resin material, or a metal material. An inclined surface may be disposed around the LED 100.

The third electrode layer 210 and the fourth electrode layer 220 are electrically separated from each other and supply a power to the LED 100. Also, the third electrode layer 210 and the fourth electrode layer 220 may reflect light generated in the LED 100 to improve light efficiency. In addition, the third electrode layer 210 and the fourth electrode layer 220 may release heat generated in the LED 100 to the outside.

The lateral type LED illustrated in FIG. 1 or the vertical type LED illustrated in FIG. 4a may be applicable as the LED 100 according to this embodiment, but is not limited thereto. The LED 100 may be disposed on the body 200 or on the third electrode layer 210 or the fourth electrode layer 220.

The LED 100 may be electrically connected to the third electrode layer 210 and/or the fourth electrode layer 220 through a wire. In this embodiment, since the lateral type LED 100 is explained as an example, two wires 300 may be used. Alternatively, when the LED 100 includes a horizontal type LED, one wire may be used. Also, when the LED 100 includes a flip chip type LED, the wire may not be used.

The molding member 400 may surround the LED 100 to protect the LED 100. Also, a phosphor may be contained in the molding member 400 to vary a wavelength of light emitted from the LED 100.

The light emitting device package according to an embodiment may be applicable to a lighting system. The lighting system may include a lighting unit illustrated in FIG. 8, a backlight unit illustrated in FIG. 9, traffic lights, a vehicle headlight, and a sign.

Figure 8:
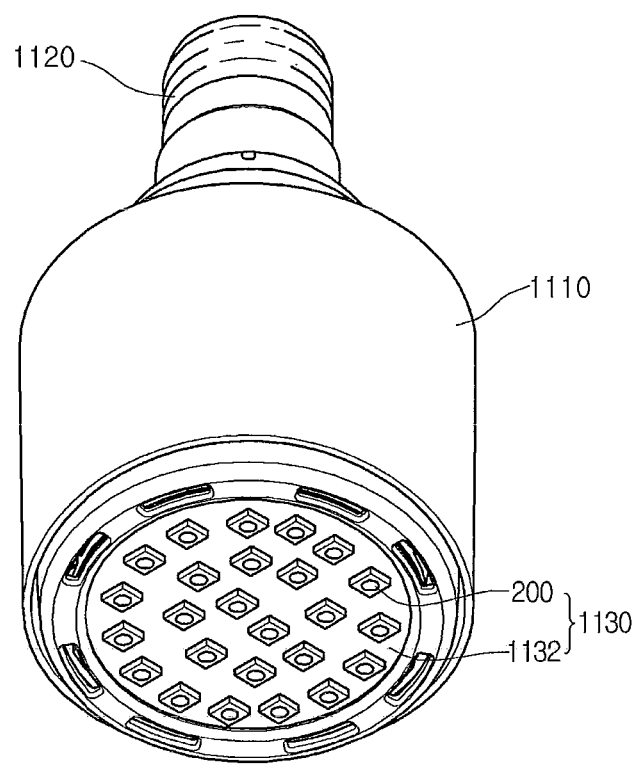
FIG. 8 is a perspective view of a lighting unit according to an embodiment.

FIG. 8 is a perspective view of a lighting unit according to an embodiment.

Referring to FIG. 8, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 1210 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

At least one light emitting device package 1210 may be mounted on the substrate 1132. The light emitting device package 1210 may include at least one light emitting diode (LED) 100. The LED 100 may include a colored LED that emits red, green, blue, or white light and an UV LED that emits ultraviolet (UV) light.

The light emitting module 1130 may include a plurality of light emitting device packages 1210 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 8, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 9:
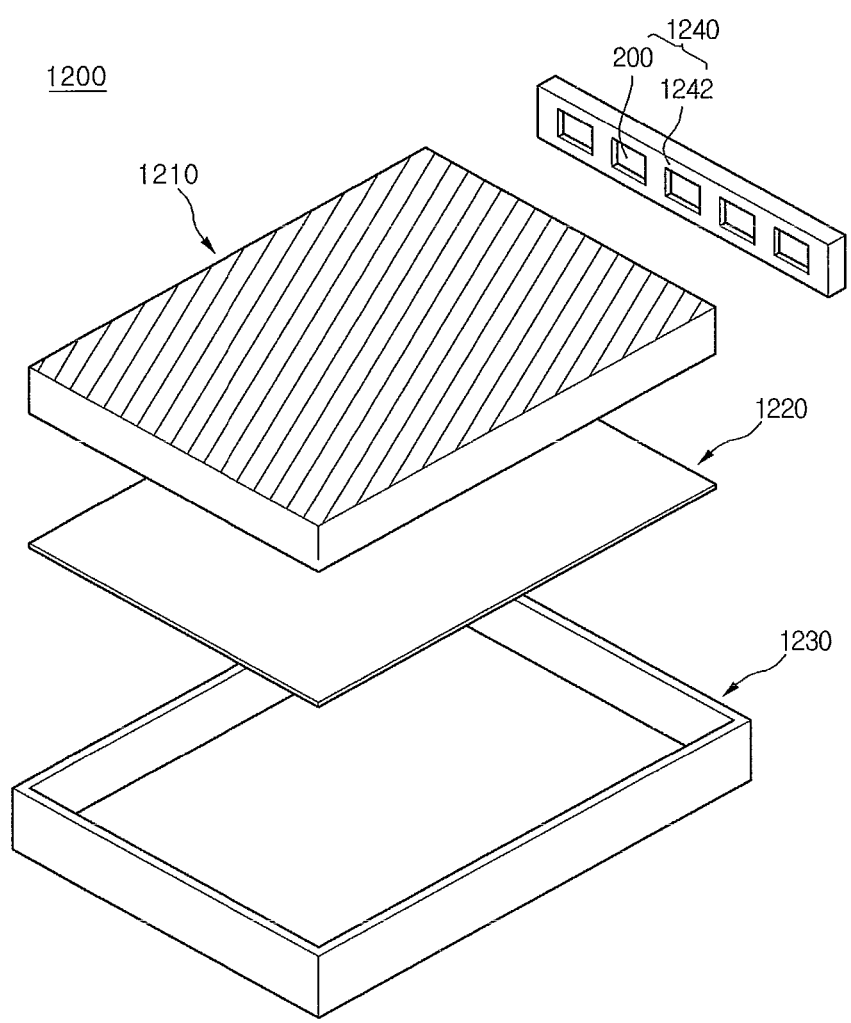
FIG. 9 is a perspective view of a backlight unit according to an embodiment.

FIG. 9 is a perspective view of a backlight unit according to an embodiment.

A backlight unit 1200 according to an embodiment may include a light guide plate 1210, a light emitting module 1240, a reflective member 1220, and a bottom cover 1230, but is not limited thereto. The light emitting module 1240 may contact at least one surface of the light guide plate 1210 to provide light the light guide plate 1210, but is not limited thereto. The reflective member 1220 may be disposed below the light guide plate 1210. The bottom cover 1230 may receive the light guide plate 1210, the light emitting module 1240, and the reflective member 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may be used as a light source of a display device including the backlight unit.

The light emitting module 1240 may contact the light guide plate 1210 but is not limited thereto.

In particular, the light emitting module 1240 may include a substrate 1242 and a plurality of light emitting device package 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The plurality light emitting device packages 200 may be mounted on the substrate 1242. Also, a light emitting surface of each of the light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member 1220 may be formed of one of PET, PC, and PVC, but is not limited thereto.

The bottom cover 1230 may store the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure comprising a first conductive type semiconductor layer, an active layer, and a second conductive type semiconductor layer; and
an anti-reflection region on the light emitting structure,
wherein the anti-reflection region comprises an anti-reflection layer, and
wherein the anti-reflection layer comprises at least two layers having refractive indexes different from each other,
wherein the anti-reflection layer comprises:
a first refractive layer having a first refractive index;
a second refractive layer having a second refractive index greater than the first refractive index on the first refractive layer; and
a third refractive layer having a third refractive index greater than the second refractive index, and the second refractive layer is disposed on the third refractive layer.

2. The light emitting device according to claim 1, wherein the anti-reflection layer is on lateral surfaces of the first conductive type semiconductor layer, the active layer, and the second conductive type semiconductor layer.

3. The light emitting device according to claim 1, wherein, in the anti-reflection layer, wavelengths reflected from a boundary of the respective layers are destructively interfere with each other.

4. The light emitting device according to claim 1, wherein the first refractive layer and the second refractive layer have thicknesses of odd multiples of $\lambda/4$.

5. The light emitting device according to claim 1, wherein the first refractive index ranges from 1.3 to 1.5, and the second refractive index ranges from 1.6 to 1.8.

6. The light emitting device according to claim 1, wherein the third refractive layer has a thickness of $\lambda/2$.

7. The light emitting device according to claim 1, wherein the third refractive index ranges from 2.0 to 2.5.

8. The light emitting device according to claim 2, wherein the anti-reflection layer comprises a roughness on lateral surfaces of the first conductive type semiconductor layer, the active layer, and the second conductive type semiconductor layer.

9. The light emitting device according to claim 1, wherein the light emitting device comprises a lateral type light emitting device or a vertical type light emitting device.

10. A light emitting device package comprising:
a light emitting device including a light emitting structure and an anti-reflection region on the light emitting structure; and
a package body in which the light emitting device is disposed,
wherein the anti-reflection region comprises an anti-reflection layer,
wherein the anti-reflection layer comprises two or more layers having refractive indexes different from each other, and wavelengths reflected from each boundary of the anti-reflection layer destructively interfere with each other,
wherein the anti-reflection layer is on lateral surfaces of the light emitting structure, and
wherein the anti-reflection layer comprises a roughness on lateral surfaces of the light emitting structure.

11. The light emitting device according to claim 10, wherein the anti-reflection layer comprises:
a first refractive layer having a first refractive index, the first refractive layer being on both lateral surfaces of the light emitting structure;
a second refractive layer having a second refractive index greater than the first refractive index, the second refractive layer being on the first refractive layer; and
a third refractive layer having a third refractive index greater than the second refractive index, the second refractive layer being on the third refractive layer.

12. A lighting system comprising:
a light emitting module comprising a light emitting device package including a light emitting device comprising an anti-reflection region on a light emitting structure; and
a package body in which the light emitting device is disposed,
wherein the anti-reflection region comprises an anti-reflection layer, and
wherein the anti-reflection layer comprises at least two layers having refractive indexes different from each other,
wherein the anti-reflection layer is on lateral surfaces of the light emitting structure, and
wherein the anti-reflection layer comprises a roughness on lateral surfaces of the light emitting structure.

* * * * *